United States Patent
Ko

(10) Patent No.: US 8,947,152 B2
(45) Date of Patent: Feb. 3, 2015

(54) MULTI-CHIP PACKAGE

(71) Applicant: SK Hynix Inc., Gyeonggi-do (KR)

(72) Inventor: Jae-Bum Ko, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/038,363

(22) Filed: Sep. 26, 2013

(65) Prior Publication Data

US 2014/0306748 A1    Oct. 16, 2014

(30) Foreign Application Priority Data

Apr. 11, 2013  (KR) .......................... 10-2013-0040054

(51) Int. Cl.
*H03K 17/00* (2006.01)
*H01L 27/02* (2006.01)

(52) U.S. Cl.
CPC ................................ *H01L 27/0214* (2013.01)
USPC ......................................... 327/365; 327/526

(58) Field of Classification Search
USPC ................................................ 327/365–508
See application file for complete search history.

(56) References Cited

U.S. PATENT DOCUMENTS

| | | | |
|---|---|---|---|
| 4,661,979 A * | 4/1987 | Jakab | 379/412 |
| 8,686,777 B1 * | 4/2014 | Narang et al. | 327/261 |
| 2004/0239400 A1 * | 12/2004 | Kunemund | 327/408 |
| 2011/0128072 A1 | 6/2011 | Choi et al. | |
| 2011/0267137 A1 * | 11/2011 | Ko et al. | 327/526 |

* cited by examiner

*Primary Examiner* — Brandon S Cole
(74) *Attorney, Agent, or Firm* — IP & T Group LLP

(57) ABSTRACT

A multi-chip package having a plurality of slice chips coupled through a through-via, at least one slice chip may include an input unit suitable for receiving a slice activation signal, and outputting the slice activation signal to the through-via in response to a slice identification corresponding to the slice chip, a first output unit suitable for outputting the activation signal transferred through the through-via to an internal circuit of the slice chip in response to the corresponding slice identification, and a second output unit suitable for selectively outputting the activation signal transferred through the through-via to the internal circuit of the slice chip in a predetermined activation mode for the multi-chip package.

8 Claims, 3 Drawing Sheets

MULTI-CHIP PACKAGE

CROSS-REFERENCE TO RELATED APPLICATIONS

The present application claims priority of Korean Patent Application No. 10-2013-0040054, filed on Apr. 11, 2013, which is incorporated herein by reference in its entirety.

BACKGROUND

1. Field

Exemplary embodiments of the present invention relate to a semiconductor design technology, and more particularly, to a multi-chip package.

2. Description of the Related Art

Generally, a semiconductor device including a double data rate synchronous dynamic random access memory (DDR SDRAM) has developed to satisfy needs of consumers.

Recently, a multi-chip package as a package technology of a semiconductor device is introduced. The multi-chip package represents one chip having a plurality of semiconductor chips. The multi-chip package increases a memory capacity using a plurality of memory chips or improves a performance using a semiconductor chip having different functions.

For reference, the multi-chip package is classified to a single-layered multi-chip package and a multi-layered multi-chip package. The single-layered multi-chip package represents that a plurality of semiconductor chips are laterally arrayed on a plane. The multi-layered multi-chip package represents that a plurality of semiconductor chips are stacked.

FIG. 1 shows a diagram illustrating a conventional multi die package.

Referring to FIG. 1, the conventional multi die package 100 includes a plurality of semiconductor chips CP_1 to CP_N and a substrate 110. The plurality of semiconductor chips CP_1 to CP_N are vertically stacked. Each of the plurality of semiconductor chips CP_1 to CP_N is coupled to the substrate 110. A pad of each of the plurality of semiconductor chips CP_1 to CP_N is arrayed on an edge of each of the plurality of semiconductor chips CP_1 to CP_N. The substrate 110 is electrically coupled to the pad of each of the plurality of semiconductor chips CP_1 to CP_N using a Tire.

However, since the interconnection is arrayed along an edge of the plurality of semiconductor chips CP_1 to CP_N, an area of the plurality of semiconductor chips CP_1 to CP_N may be increased, and an interposer layer may be requested to be arrayed between the plurality of semiconductor chips CP_1 to CP_N. Thus, while the multi die package may have merits than the single-layered multi-chip package, it may have demerits in view of a footprint because a form factor is increased.

Moreover, although a gold wire is arrayed between pads to improve a quality of a signal transferred through a wire, because of a hetero junction, a transfer speed of data is lowered and a skew of a signal may occur in stacked dies. Thus, this concern may cause a power over-consumption and lower the reliability of a signal.

SUMMARY

Exemplary embodiments of the present invention are directed to a multi-chip package having a through-silicon-via (TSV).

Moreover, exemplary embodiments of the present invention are directed to a multi-chip package for performing various operations according to an activation mode without adding a through-silicon-via (TSV).

In accordance with an exemplary embodiment of the present invention, a multi-chip package having a plurality of slice chips coupled through a through-via, at least one slice chip may include an input unit suitable for receiving a slice activation signal, and outputting the slice activation signal to the through-via in response to a slice identification corresponding to the slice chip, a first output unit suitable for outputting the activation signal transferred through the through-via to an internal circuit of the slice chip in response to the corresponding slice identification, and a second output unit suitable for selectively outputting the activation signal transferred through the through-via to the internal circuit of the slice chip in a predetermined activation mode for the multi-chip package.

In accordance with another exemplary embodiment of the present invention, a multi-chip package system may include a multi-chip package having a plurality of slice chips coupled each other by using a first through-via and a second through-via, wherein at least one slice chip includes, a first signal transfer unit, and a second signal transfer unit, wherein the first signal transfer unit is suitable for transferring a first slice activation signal to the first through-via and an internal circuit of the slice chip, and the second signal transfer unit is suitable for transferring a second slice activation signal to the second through-via and the internal circuit of the slice chip, and a controller suitable for providing the first slice activation signal to the multi-chip package or the first and the second slice activation signals to the multi-chip package, and controlling a predetermined activation mode for the multi-chip package.

In accordance with yet another exemplary embodiment of the present invention, a multi-chip package having a plurality of slice chips coupled through a through-via, at least one slice chip may include a first signal transfer unit having a first output unit and a second output unit, wherein the second output unit is suitable for outputting a first slice activation signal transferred through a first through-via to an internal circuit of the slice chip in a predetermined activation mode for the multi-chip package, and a second signal transfer unit suitable for outputting a predetermined signal transferred through a second through-via to the internal circuit of the slice chip, wherein the second signal transfer unit includes an output unit suitable for outputting the predetermined signal to the internal circuit, and a dummy output unit connected to the second through-via.

DETAILED DESCRIPTION

Figure 1:
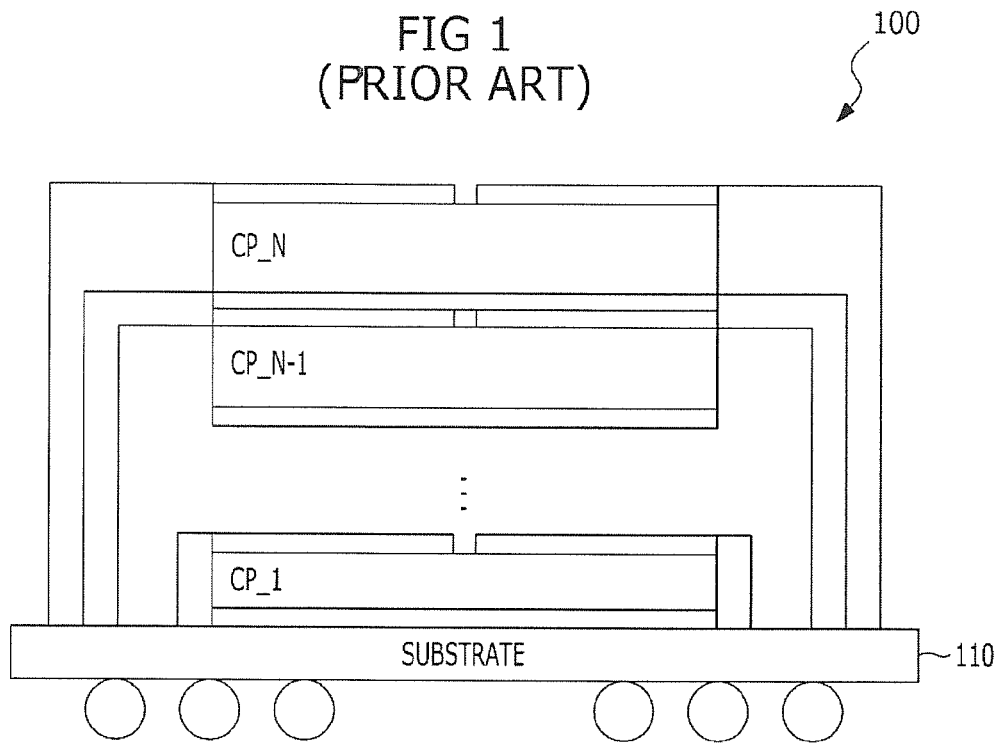
FIG. 1 is a diagram illustrating a conventional multi die package.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention. It should be readily understood that the meaning of "on" and "over" in the present disclosure should be interpreted in the broadest manner such that "on" means not only "directly on" but also "on" something with an intermediate feature(s) or a layer(s) therebetween, and that "over" means not only directly on top but also on top of something with an intermediate feature(s) or a layer(s) therebetween.

Figure 2:
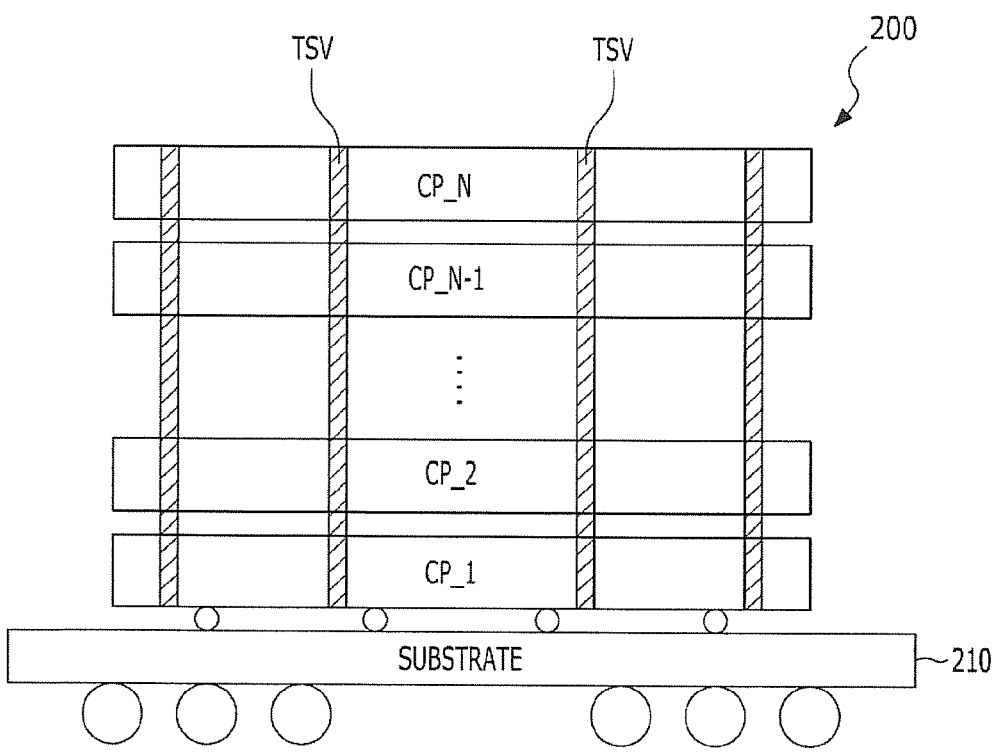
FIG. 2 is a diagram illustrating a multi-chip package using a through-silicon-via (TSV) in accordance with an embodiment of the present invention.

FIG. 2 is diagram illustrating a multi-chip package using a through-silicon-via (TSV) in accordance with an embodiment of the present invention.

As shown in FIG. 2, a multi-chip package 200 includes a plurality of semiconductor chips CP_1 to CP_N and a substrate 210.

The plurality of semiconductor chips CP_1 to CP_N are vertically stacked and electrically coupled through the TSV. The plurality of semiconductor chips CP_1 to CP_N includes a master chip CP_1 and a plurality of slave chips CP_2 to CP_N.

The master chip CP_1 is coupled to the substrate 210, and controls the plurality of slave chips CP_2 to CP_N using signals transferred through the substrate 210. A structure of a multi-chip package using the TSV may be useful for a high speed operation and a low power consumption. Also, a structure of a multi-chip package using the TSV may be minimized in size, compared to a structure of a multi-chip package using a wire, because an interconnection distance between a plurality of semiconductor chips is reduced.

Hereinafter, for the convenience of the descriptions, a plurality of semiconductor chips CP_1 to CP_N are referred to as 'a plurality of slice chips'. That is, the multi-chip package 200 includes a plurality of slice chips CP_1 to CP_N, which are coupled to each other through the TSV.

Meanwhile, in a conventional multi die package as shown in FIG. 1, since a slice activation signal for activating a corresponding slice chip is applied to each slice chip, a selection operation for activating a corresponding slice chip is relatively simple.

However, it is difficult to perform a selection operation for activating a corresponding slice chip in a multi-chip using a TSV as shown in FIG. 2. Although a selection operation is performed by adding a TSV for each of the plurality of slice chips, this design has a concern of increasing a number of wires.

Hereinafter, as described below, a multi-chip package in accordance with an embodiment of the present invention may select and activate one of a plurality of slice chips without adding a TSV. For the convenience of the descriptions, a plurality of slice chips are activated in response to a clock enable signal. Herein, the clock enable signal is a signal for controlling an activation state of a clock signal provided to a corresponding slice chip. Also, the clock enable signal is a signal that is most early activated for an operation of the corresponding slice chip. That is, each of the plurality of slice chips is activated when the clock enable signal is input.

Figure 3:
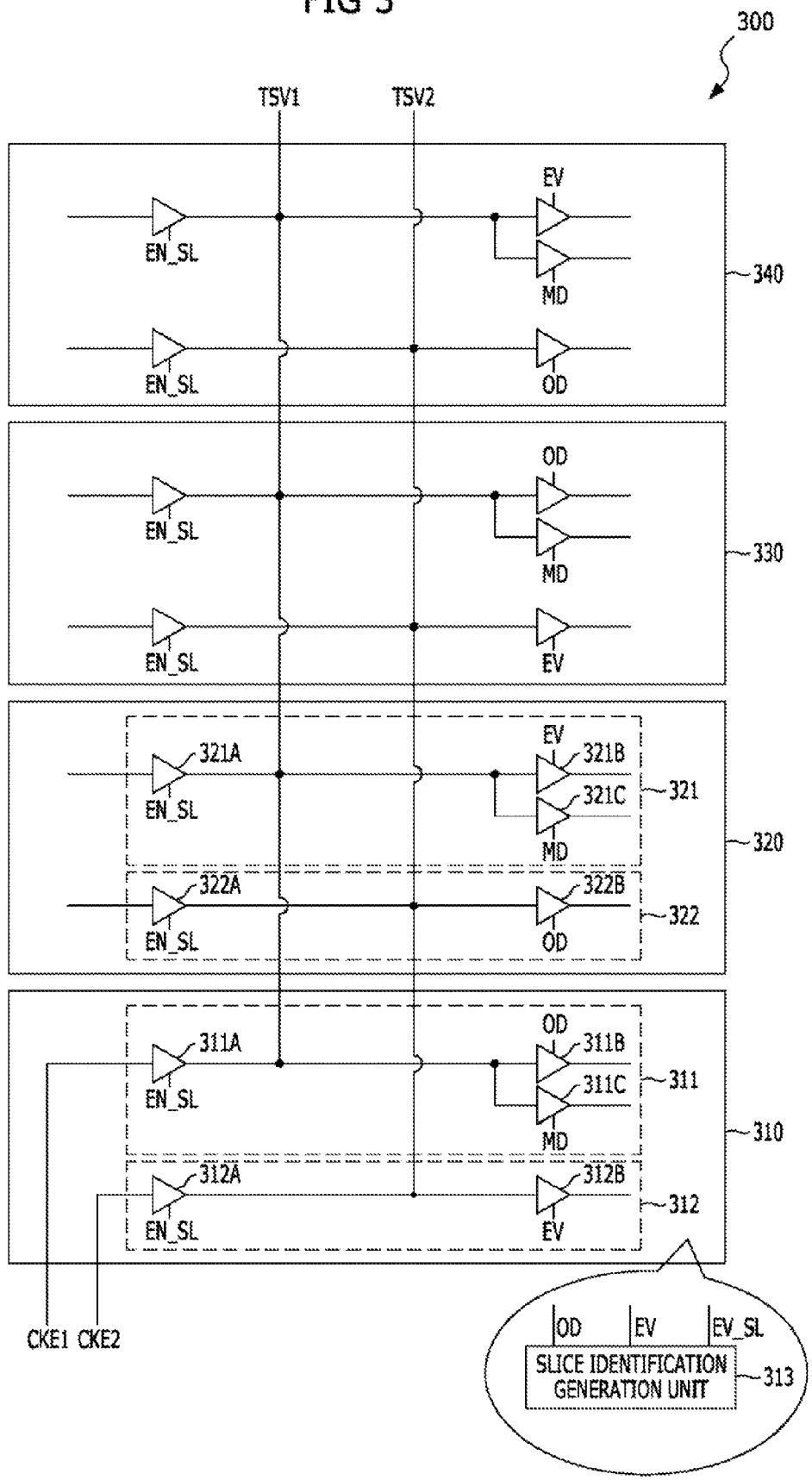
FIG. 3 is a diagram illustrating a multi-chip package in accordance with an embodiment of the present invention.

FIG. 3 is a diagram illustrating a multi-chip package in accordance with an embodiment of the present invention. For the convenience of the descriptions, it is assumed that four slice chips 310 to 340 are selectively activated in response to a first clock enable signal CKE1 and a second clock enable signal CKE2.

Referring to FIG. 3, a multi-chip package 300 includes a first slice chip 310, a second slice chip 320, a third slice chip 330 and a fourth slice chip 340. The first to fourth slice chips 310 to 340 are coupled to each other through a first TSV TSV1 and a second TSV TSV2. Herein, the first TSV TSV1 is used for transferring the first clock enable signal CKE1. The second TSV TSV2 is used for transferring the second clock enable signal CKE2.

For the convenience of the descriptions, it is assumed that the first slice chip 310 and the third slice chip 330 are arrayed on an odd number layer, and the second slice chip 320 and the fourth slice chip 340 are arrayed on an even number layer.

The first slice chip 310 includes a first signal transfer unit 311, a second signal transfer unit 312, and a slice identification generation unit 313.

The first signal transfer unit 311 transfers the first clock enable signal CKE1 to the first TSV TSV1 and an internal circuit (not shown) of the first slice chip 310. The first signal transfer unit 311 includes a first input unit 311A, a first output unit 311B, and a second output unit 311C. The first input unit 311A outputs the first clock enable signal CKE1 to the first TSV TSV1 in response to a selection control signal EN_SL. The first output unit 311B outputs a signal transferred through the first TSV TSV1 to the internal circuit (not shown) of the first slice chip 310 in response to an odd control signal OD. The second output unit 311C outputs a signal transferred through the first TSV TSV1 to the internal circuit (not shown) of the first slice chip 310 in response to an activation mode signal MD.

Herein, the activation mode signal MD is a signal corresponding to an activation operation of the first to the fourth slice chips 310 to 340, and includes a 3-dimension structure (3DS) mode and a quad die package (QDP) mode. The 3DS mode represents that the first to the fourth slice chips 310 to 340 are activated in response to the first clock enable signal CKE1. The QDP mode represents that the first and third slice chips 310 and 330 and the second and the fourth slice chips 320 and 340 are separately activated in response to the first clock enable signal CKE1 and the second clock enable signal CKE2.

The second signal transfer unit 312 transfers the second clock enable signal CKE2 to the second TSV TSV2 and the internal circuit (not shown) of the first slice chip 310. The second signal transfer unit 312 includes an input unit 312A and an output unit 312B. The input unit 312A outputs the second dock enable signal CKE2 to the second TSV TSV2 in response to the selection control signal EN_SL. The output unit 312B outputs a signal transferred through the second TSV TSV2 to the internal circuit (not shown) of the first slice chip 310 in response to an even control signal EV.

The slice identification generation unit 313 controls the signal transmission of the first signal transfer unit 311 and the second signal transfer unit 312. The slice identification generation unit 313 generates the odd control signal OD, the even control signal EV and the selection control signal EN_SL according to a stacked sequence of the first to the fourth slice chips 310 to 340. That is, the slice identification generation unit 313 allocates the identification corresponding to a first layer to the first slice chip 310. A slice identification generation unit (not shown) of the second slice chip 320 allocates the identification corresponding to a second layer to the second slice chip 320. A slice identification generation unit (not shown) of the third slice chip 330 allocates the identification corresponding to a third layer to the third slice chip 330. A slice identification generation unit (not shown) of the fourth slice chip 340 allocates the identification corresponding to a fourth layer to the fourth slice chip 340.

For example, the first slice chip 310 receives the identification corresponding to the first layer. The odd control signal ODD corresponding to an odd layer is activated. The even control signal EV corresponding to an even layer is inactivated. The second slice chip 320 receives the identification corresponding to the second layer. The even control signal EV corresponding to the even layer is activated. The odd control signal OD corresponding to the odd layer is inactivated. The selection control signal EN_SL is activated in, for example, only the identification corresponding to the first layer and is not activated in the other identification corresponding to the other layers.

Hereinafter, an operation of the multi-chip package 300 for the QDP mode and the 3DS mode will be described.

In the QDP mode, the multi-chip package 300 receives the first clock enable signal CKE1 and the second clock enable signal CKE2, and controls an activation operation of the first and the third slice chips 310 and 330 and the second and the fourth slice chips 320 and 340, respectively. In the 3DS mode, the multi-chip package 300 receives, for example, only the first clock enable signal CKE1 and controls an activation operation of the first to the fourth slice chips 310 to 340. The odd control signal OD of the slice chip arrayed on the first layer is activated, and the selection control signal EV is inactivated. The even control signal EV of the slice chip arrayed on the even layer is activated and the odd control signal OD is inactivated.

More specifically, the QDP mode will be described as below.

In the QDP mode, the multi-chip package 300 receives the first dock enable signal CKE1 and the second dock enable signal CKE2.

The first dock enable signal CKE1 is input to the first input unit 311A of the first slice chip 310, and is transferred to the first TSV TSV1. Then, the first clock enable signal CKE1 is transferred to an internal circuit (not shown) of the first slice chip 310 through the first output unit 311B in response to an activated odd control signal OD. The first slice chip 310 is activated in response to the first clock enable signal CKE1 transferred through the first output unit 311B.

The second clock enable signal CKE2 is input to the input unit 312A of the first slice chip 310, and is transferred to the second TSV TSV2. But, since the even control signal EV is not activated, the second clock enable signal CKE2 is not transferred to an internal circuit (not shown) of the first slice chip 310 through the output unit 312B.

Next, the second slice chip 320 arrayed on the even layer is operated contrary to the first slice chip 310. That is, the second clock enable signal CKE2 transferred through the second TSV TSV2 is transferred to the internal circuit (not shown) of the second slice chip 320 through the first output unit 321B. The first clock enable signal CKE1 transferred through the first TSV TSV1 is not transferred to the internal circuit (not shown) of the second slice chip 320.

Thus, the first and the third slice chips 310 and 330 are activated in response to the first clock enable signal CKE1. The second and the fourth slice chips 320 and 340 are activated in response to the second clock enable signal CKE2.

Meanwhile, in a QDP mode, an activation mode signal MD is inactivated. Thus, the first clock enable signal CKE1 transferred through the first TSV TSV1 is not transferred to the internal circuit (not shown) through the second output unit 311C, 321C, 331C and 341C of each of the first to the fourth slice chips 310 to 340.

Next, the 3DS mode will be described as below.

In the 3DS mode, the activation mode MD is activated and, for example, only the first clock enable signal CKE1 is received.

The first clock enable signal CKE1 is input to the first input unit 311A of the first slice chip 310, and is transferred to the first TSV TSV1. Then, the first clock enable signal CKE1 is transferred to the internal circuit (not shown) of the first slice chip 310 through the first output unit 311B in response to an activated odd control signal OD. The first slice chip 310 is activated in response to the first clock enable signal CKE1 transferred through the first output unit 311B.

Subsequently, the second slice chip 320 arrayed on the even layer receives the first clock enable signal CKE1 transferred through the first TSV TSV1. The first clock enable signal CKE1 is transferred to the internal circuit (not shown) of the second slice chip 320 through the second output unit 321C in response to an activated activation mode signal MD. The second slice chip is activated in response to the first clock enable signal CKE1.

Since an operation of the third slice chip 330 and the fourth slice chip 340 is similar to an operation of the first slice chip 310 and the second slice chip 320, the descriptions of the third slice chip 330 and the fourth slice chip 340 will be omitted.

Thus, in the 3DS mode, the first clock enable signal CKE1 controls an activation operation of the first to the fourth slice chips 310 to 340.

The multi-chip package in accordance with an embodiment of the present invention may perform compatibility of the 3DS mode for receiving, for example, only the first clock enable signal CKE1 and the QDP mode for receiving the first and the second enable signals CKE1 and the CKE2.

Figure 4:
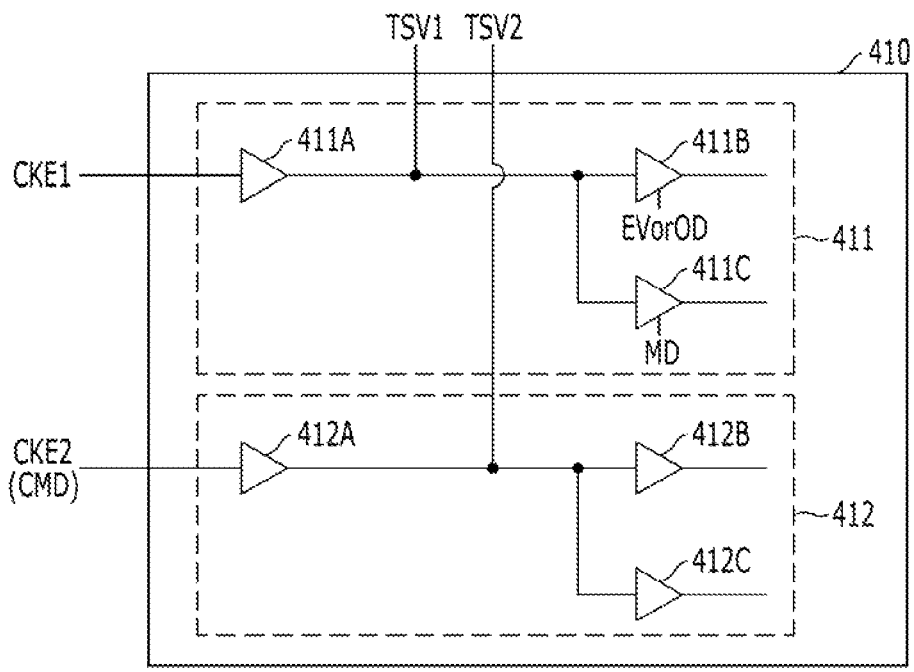
FIG. 4 is a diagram illustrating a multi-chip package in accordance with another embodiment of the present invention.

FIG. 4 is a diagram illustrating a multi-chip package in accordance with another embodiment of the present invention. For the convenience of the descriptions, a fourth slice chip 410 among a plurality of slice chips is shown in FIG. 4.

Referring to FIG. 4, the fourth slice chip 410 includes a first signal transfer unit 411 and a second signal transfer unit 412.

The first signal transfer unit 411 transfers a first clock enable signal CKE1 an internal circuit (not shown) of the fourth slice chip 410 in response to an activation mode signal MD. The first signal transfer unit 411 includes a first input unit 411A, a first output unit 411B and a second output unit 411C. Since the first input unit 411A, the first output unit 411B and the second output unit 411C shown in FIG. 4 are same as the first input unit 311A, the first output unit 311B and the second output unit 311C shown in FIG. 3, the detailed descriptions of the first input unit 411A, the first output unit 411B and the second output unit 411C will be omitted.

Next, the second signal transfer unit 412 transfers the second clock enable signal CKE2 to an internal circuit (not shown) of the fourth slice chip 410. The second signal transfer unit 412 includes an input unit 412A, an output unit 412B and a dummy output unit 412C. The input unit 412A and the output unit 412B are used for transferring the second clock enable signal CKE2. The dummy output unit 412C is used in a same loading of the first clock enable signal CKE1 transferred to the first signal transfer unit 411 and the second clock enable signal CKE2 transferred to the second signal transfer unit 412.

The multi-chip package in accordance with an embodiment of the present invention may reduce a skew difference between the first clock enable CKE1 and the second dock enable CKE2 by further having the dummy output unit 412C on a transfer path of the second signal transfer unit 412, and matching a loading of the first signal transfer unit 411 and the second signal transfer unit 412.

Although the dummy output unit 412 is installed on a transfer path of the second clock enable signal CKE2 in the embodiment of the present invention shown in FIG. 4, the dummy output unit 412 may be installed on a transfer path of other signals or other command signals except the second dock enable signal CKE2, in the multi-chip package in accordance with the embodiment of the present invention.

Figure 5:
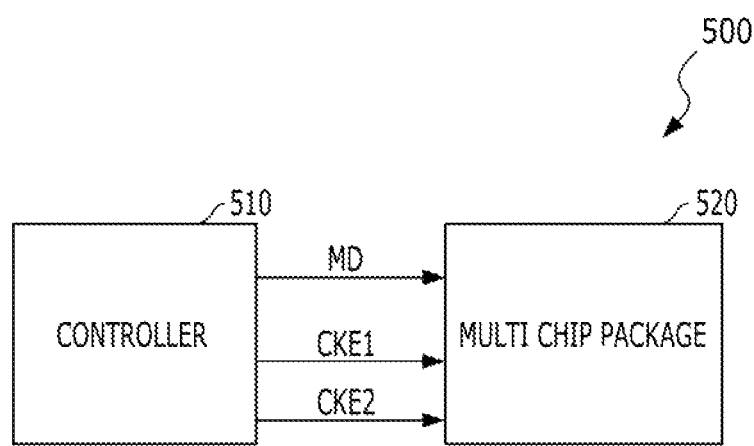
FIG. 5 is a block diagram illustrating a multi-chip package system using a multi-chip package in accordance with an embodiment of the present invention.

FIG. 5 is a block diagram illustrating a multi-chip package system using a multi-chip package in accordance with an embodiment of the present invention.

Referring to FIG. 5, a multi-chip package system 500 includes a controller 510 and a multi-chip package 520.

The controller 510 generates and provides an activation mode signal MD, a first clock enable signal CKE1 and a second clock enable signal CKE2 to the multi-chip package 520.

The multi-chip package 520 receives the activation mode signal MD, the first clock enable signal CKE1 and the second clock enable signal CKE2, and performs an activation operation of a plurality of slice chips according to a 3DS mode or a QDP mode.

For reference in a case of a conventional multi-chip package, since a QDP mode or a 3DS mode is fixed, compatibility of the DQP mode and the 3DS mode is not allowed. However, the multi-chip package system in accordance with an embodiment of the present invention may select a QDP mode or a 3DS mode using a controller.

As described above, a multi-chip package in accordance with an embodiment of the present invention may minimize a TSV, and perform a QDP mode or a 3DS mode according to an activation mode.

While the present invention has been described with respect to the specific embodiments, it will be apparent to those skilled in the art that various changes and modifications may be made without departing from the spirit and scope of the invention as defined in the following claims.

What is claimed is:

1. A multi-chip package system, comprising:
   a multi-chip package having a plurality of slice chips coupled each other by using a first through-via and a second through-via,
   wherein at least one slice chip includes:
      a first signal transfer unit, and
      a second signal transfer unit, wherein the first signal transfer unit is suitable for transferring a first slice activation signal to the first through-via and an internal circuit of the slice chip, and the second signal transfer unit is suitable for transferring a second slice activation signal to the second through-via and the internal circuit of the slice chip; and
   a controller suitable for providing the first slice activation signal to the multi-chip package or the first and the second slice activation signals to the multi-chip package, and controlling a predetermined activation mode for the multi-chip package.

2. The multi-chip package system of claim 1, wherein the first signal transfer unit receives information corresponding to the predetermined activation mode and controls to transfer the first slice activation signal to the internal circuit of the slice chip.

3. The multi-chip package system of claim 2, wherein the first signal transfer unit comprises:
   an input unit suitable for receiving the first slice activation signal, and output the first slice activation signal to the first through-via in response to a slice identification corresponding the slice chip;
   a first output unit suitable for outputting the first slice activation signal transferred through the first through-via to the internal circuit of the slice chip in response to the slice identification; and
   a second output unit suitable for controlling to transfer the first slice activation signal transferred through the first through-via to the internal circuit of the slice chip in a predetermined activation mode for the multi-chip package.

4. The multi-chip package system of claim 2, wherein the second signal transfer unit comprises:
   an input unit suitable for receiving the second slice activation signal, and output the second slice activation signal to the second through-via in response to the slice identification; and
   an output unit suitable for outputting the second slice activation signal transferred through the second through-via to the internal circuit of the slice chip in response to the slice identification.

5. The multi-chip package system of claim 2, wherein the predetermined activation mode includes a first activation mode for activating the plurality of slice chips in response to the first activation signal, and a second activation mode for activating the plurality of slice chips in response to the first and the second activation signals.

6. A multi-chip package having a plurality of slice chips coupled through a through-via, at least one slice chip comprising:
   a first signal transfer unit having a first output unit and a second output unit, wherein the second output unit is suitable for outputting a first slice activation signal transferred through a first through-via to an internal circuit of the slice chip in a predetermined activation mode for the multi-chip package; and
   a second signal transfer unit suitable for outputting a predetermined signal transferred through a second through-via to the internal circuit of the slice chip,
   wherein the second signal transfer unit includes:
      an output unit suitable for outputting the predetermined signal to the internal circuit; and
      a dummy output unit connected to the second through-via.

7. The multi-chip package of claim 6, wherein the predetermined activation mode includes a activation mode for activating all of the slice chips in response to one activation signal.

8. The multi-chip package of claim 6, wherein a loading of the first signal transfer unit is matched with a loading of the second signal transfer unit.

* * * * *